(12) United States Patent
Jung et al.

(10) Patent No.: US 7,937,833 B2
(45) Date of Patent: May 10, 2011

(54) METHOD OF MANUFACTURING CIRCUIT BOARD

(75) Inventors: Hoe-Ku Jung, Daejeon (KR);
Je-Gwang Yoo, Yongin-si (KR);
Myung-Sam Kang, Suwon-si (KR);
Ji-Eun Kim, Gwangmyeong-si (KR);
Jeong-Woo Park, Suwon-si (KR);
Jung-Hyun Park, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 824 days.

(21) Appl. No.: 11/976,072

(22) Filed: Oct. 19, 2007

(65) Prior Publication Data
US 2008/0098597 A1 May 1, 2008

(30) Foreign Application Priority Data

Oct. 30, 2006 (KR) .................. 10-2006-0105924

(51) Int. Cl.
*H03K 3/02* (2006.01)
(52) U.S. Cl. ............ 29/847; 29/831; 29/846; 174/261
(58) Field of Classification Search ........... 29/620, 29/830, 831, 846, 847, 852; 156/150, 233; 216/19, 20; 257/40, 210, 211; 174/261, 174/262; 430/275.1, 277.1, 315
See application file for complete search history.

(56) References Cited

U.S. PATENT DOCUMENTS

| 2,692,190 | A | * | 10/1954 | Pritikin | ........................... 29/620 |
| 5,712,080 | A | * | 1/1998 | Satsu et al. | ................... 430/315 |
| 6,815,709 | B2 | * | 11/2004 | Clothier et al. | ............... 257/210 |

FOREIGN PATENT DOCUMENTS

JP        2004-247391        9/2004

OTHER PUBLICATIONS

Japanese Office Action issued Jan. 8, 2010 in corresponding Japanese Patent Application 2007-271056.

* cited by examiner

*Primary Examiner* — Donghai D. Nguyen

(57) ABSTRACT

A method of manufacturing a circuit board is disclosed. A method of manufacturing a circuit board that includes forming a first circuit pattern on the insulation layer of a carrier, in which an insulation layer and a first seed layer are stacked in order; stacking and pressing the carrier and an insulation board with the side of the carrier having the first circuit pattern facing the insulation board; removing the carrier to transfer the first circuit pattern and the insulation layer onto the insulation board; and forming a second circuit pattern on the insulation layer transferred to the insulation board, allows fine pitch circuit patterns to enable the manufacture of fine circuit patterns of high density on the board, and allows the manufacture of a multi-layer circuit board with a simple process.

8 Claims, 20 Drawing Sheets

METHOD OF MANUFACTURING CIRCUIT BOARD

CROSS-REFERENCE TO RELATED APPLICATIONS

This application claims the benefit of Korean Patent Application No. 10-2006-0105924 filed with the Korean Intellectual Property Office on Oct. 30, 2006, the disclosure of which is incorporated herein by reference in its entirety.

BACKGROUND

1. Technical Field

The present invention relates to a method of manufacturing a circuit board.

2. Description of the Related Art

With advances in the electronics industry, there is a growing demand for electronic components, such as in mobile devices, that provide higher performance, more functionality, and smaller sizes. Thus, there is active ongoing research for methods of manufacturing high-density boards for surface-mounted components, such as in an SiP (system in package) or 3D package, etc.

A manufacture of a conventional multi-layer circuit board in producing a board for high-density mounted components may be completed by processing holes in a double-sided copper clad laminate using a drill, performing plating inside the holes, etching the copper foil on both sides to form circuit patterns, thermal pressing several double-sided printed circuit boards having circuit patterns formed thereon with the insulating adhesive of prepreg interposed in-between, forming holes in predetermined positions of the stacked multi-layer circuit board using a drill, completing interlayer connection by plating the multi-layer circuit board to form plating layers inside the holes, and finally etching the outermost layers to form the desired circuit patterns.

Such a manufacturing process for a conventional multi-layer circuit board may entail a complicated process, and may make it difficult to form fine circuit patterns.

Also, as the overall thickness of the multi-layer circuit board is great, it is difficult to implement thin boards, and as undercutting may occur at the attachment portions between the circuit and the board, the circuits are liable to be peeled off from the board.

SUMMARY

An aspect of the invention is to provide a method of manufacturing a circuit board, which allows fine pitch circuit patterns to enable the manufacture of fine circuit patterns of high density on the board, and which allows the manufacture of a multi-layer circuit board with a simple process.

Also, another aspect of the invention is to provide a method of manufacturing a circuit board, with which a circuit board of a multi-layered structure may be manufactured by burying the circuit patterns in the board and transcribing thin insulation layers onto the board, to reduce the overall thickness of the board.

One aspect of the invention provides a method of manufacturing a circuit board that includes: forming a first circuit pattern on the insulation layer of a carrier, in which an insulation layer and a first seed layer are stacked in order; stacking and pressing the carrier and an insulation board with the side of the carrier having the first circuit pattern facing the insulation board; removing the carrier to transfer the first circuit pattern and the insulation layer onto the insulation board; and forming a second circuit pattern on the insulation layer transferred to the insulation board.

In forming the first circuit pattern, the insulation layer may be formed with a thickness of 20 μm to 25 μm in the carrier.

Also, in forming the first circuit pattern, the insulation layer may be formed by attaching an insulation film on the carrier.

Forming the first circuit pattern may include: selectively forming plating resist on the first seed layer to form an intaglio pattern corresponding to the first circuit pattern; filling conductive material in the intaglio pattern by performing electroplating; removing the plating resist; and removing the non-activated first seed layer.

The carrier may be a metal plate, in which case the removing may be performed by etching the metal plate.

Forming the second circuit pattern may include: forming a second seed layer on the insulation layer; selectively forming plating resist on the second seed layer to form an intaglio pattern corresponding to the second circuit pattern; filling conductive material in the intaglio pattern by performing electroplating; removing the plating resist; and removing the non-activated second seed layer.

In certain embodiments, forming the first circuit pattern may include forming a first circuit pattern on the insulation layer of each of two carriers, the stacking and pressing may include stacking and pressing the two carriers and an insulation board such that the sides of the carriers having the first circuit patterns formed thereon face either side of the insulation board, the removing may include removing the two carriers, and forming the second circuit pattern may include forming a second circuit pattern on the other side of each of the insulation layers.

In some examples, the method may further include forming at least one via hole in the insulation board, before forming the second circuit pattern on the other side of each of the insulation layers, and may further include selectively coating solder resist on the insulation board, after forming the second circuit pattern on the other side of each of the insulation layers.

Additional aspects and advantages of the present invention will be set forth in part in the description which follows, and in part will be obvious from the description, or may be learned by practice of the invention.

DETAILED DESCRIPTION

Figure 1:
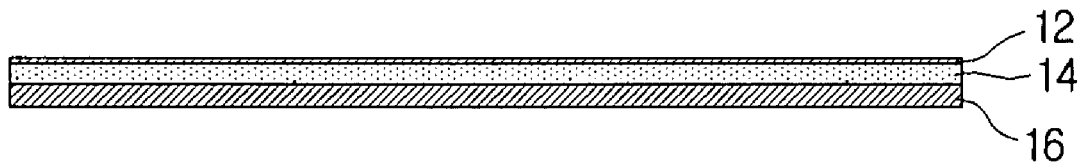
FIG. 1, FIG. 2, FIG. 3, FIG. 4, FIG. 5, FIG. 6, FIG. 7, FIG. 8, FIG. 9 and FIG. 10 represent a flow diagram illustrating a method of manufacturing a circuit board according to an embodiment of the invention.
Figure 2:
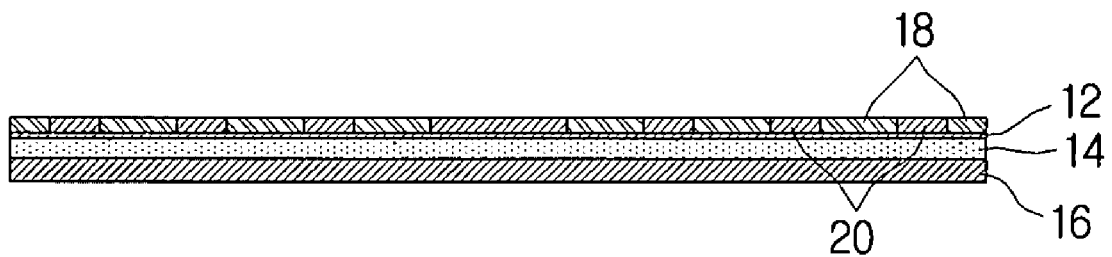
Figure 3:
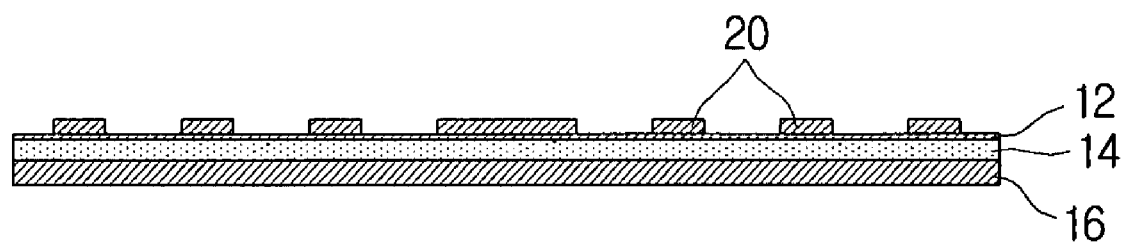
Figure 4:
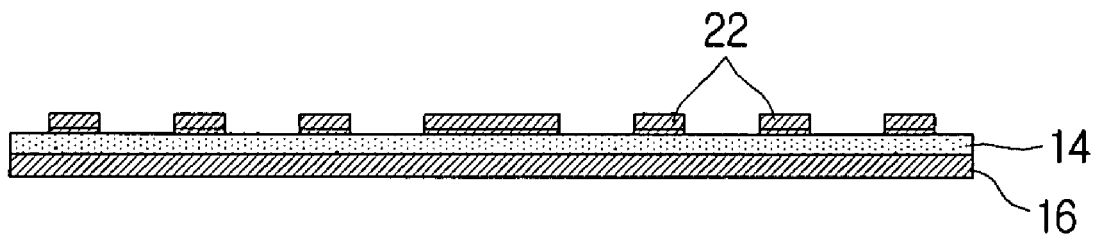
Figure 5:
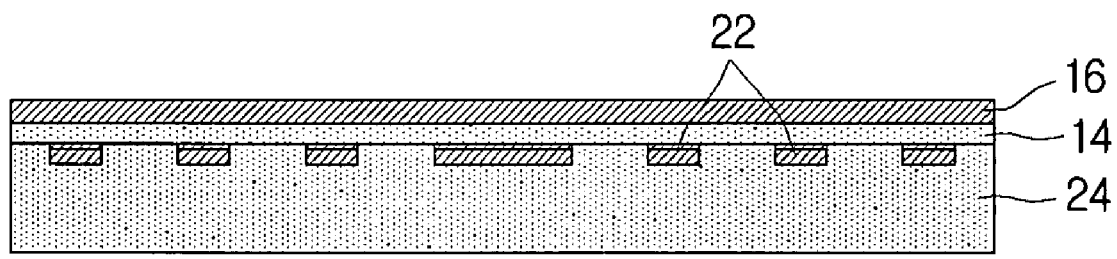
Figure 6:
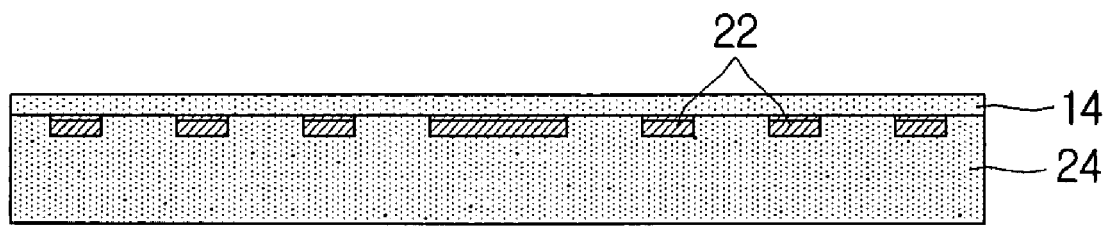
Figure 7:
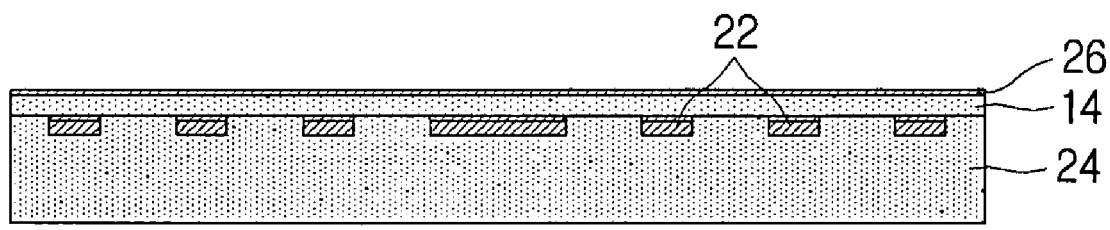
Figure 8:
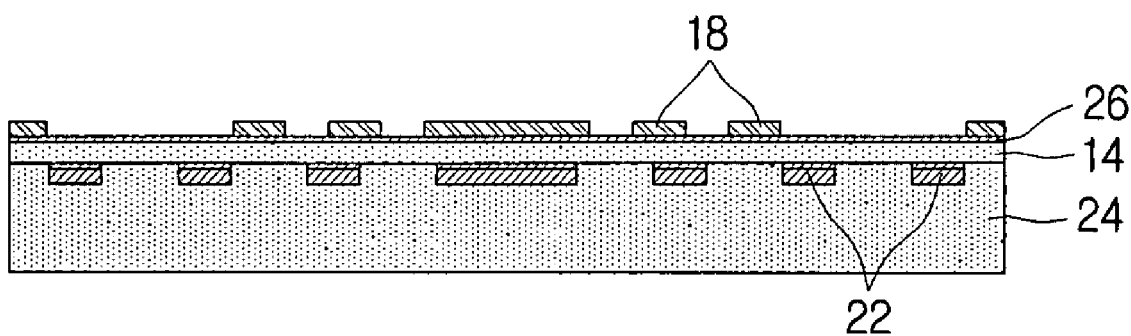
Figure 9:
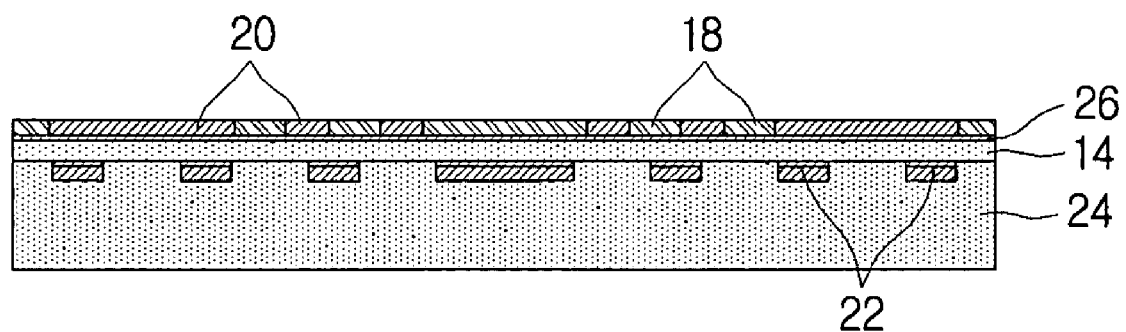
Figure 10:
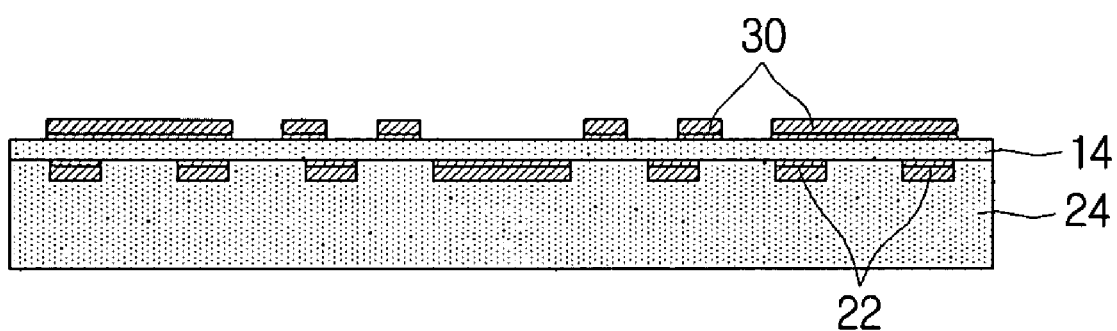
Figure 11:
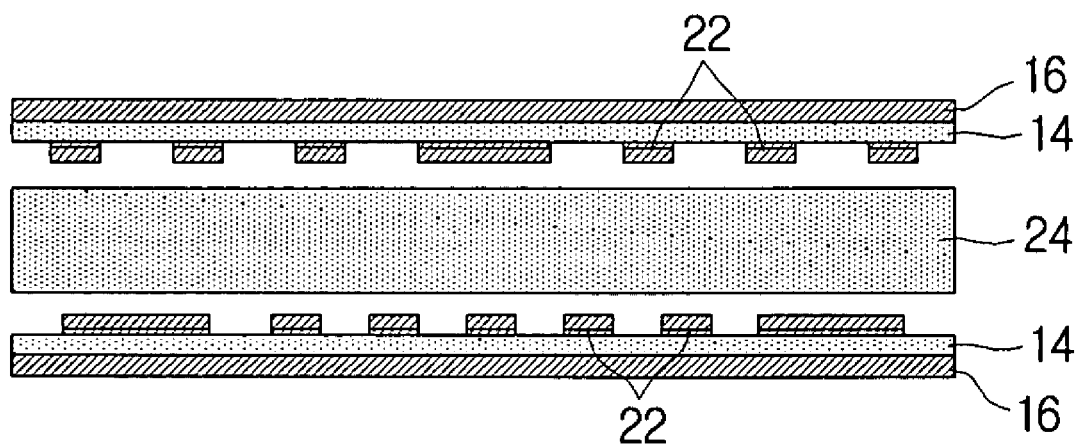
FIG. 11, FIG. 12, FIG. 13, FIG. 14, FIG. 15, FIG. 16, FIG. 17, FIG. 18 and FIG. 19 represent a flow diagram illustrating a method of manufacturing a circuit board according to another embodiment of the invention.
Figure 12:
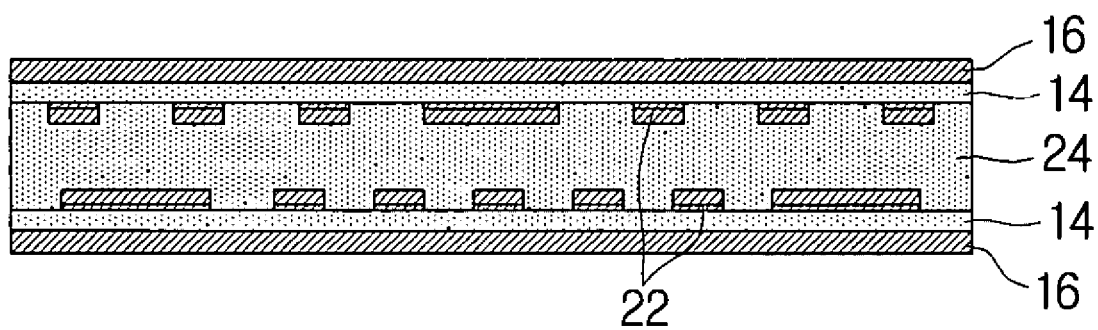
Figure 13:
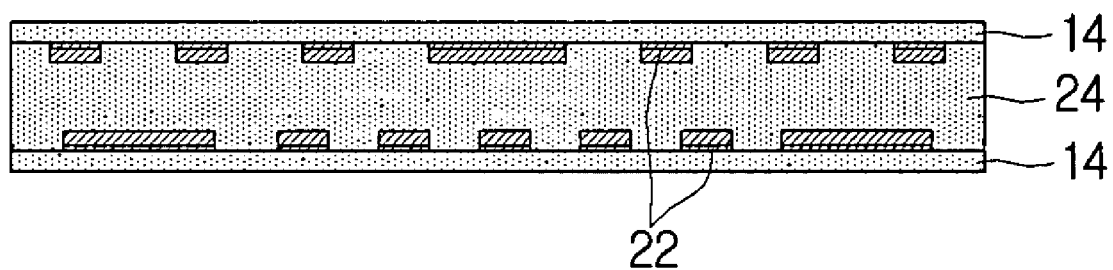
Figure 14:
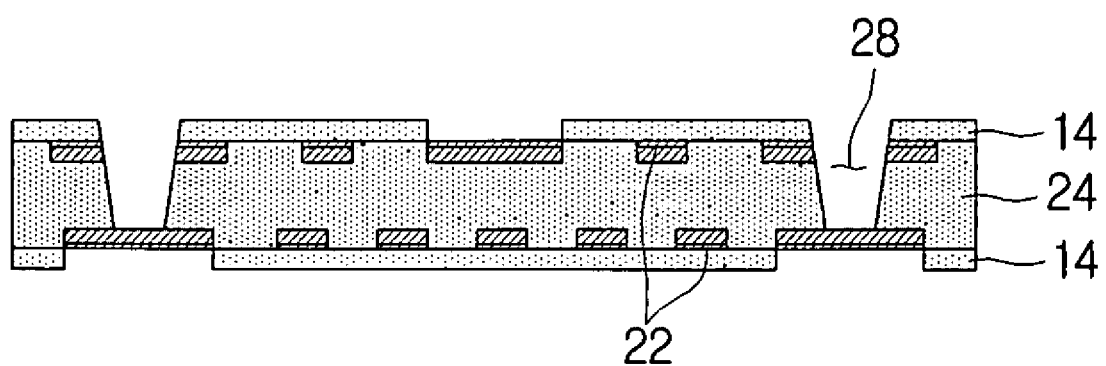
Figure 15:
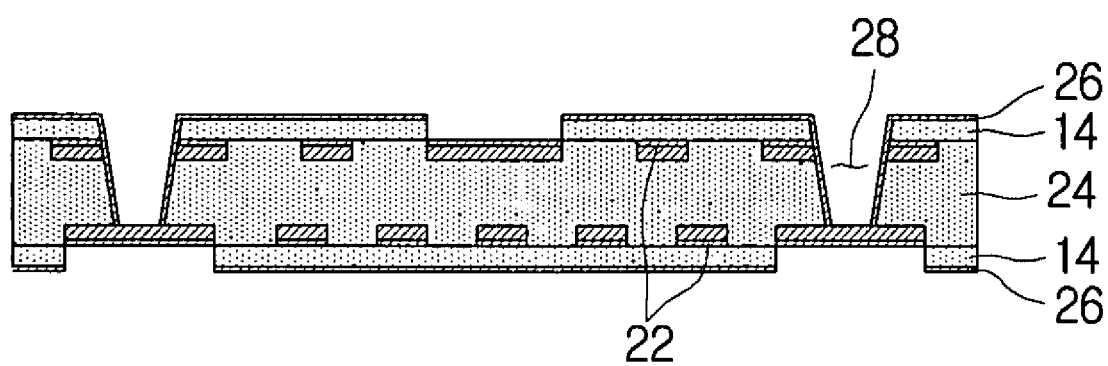
Figure 16:
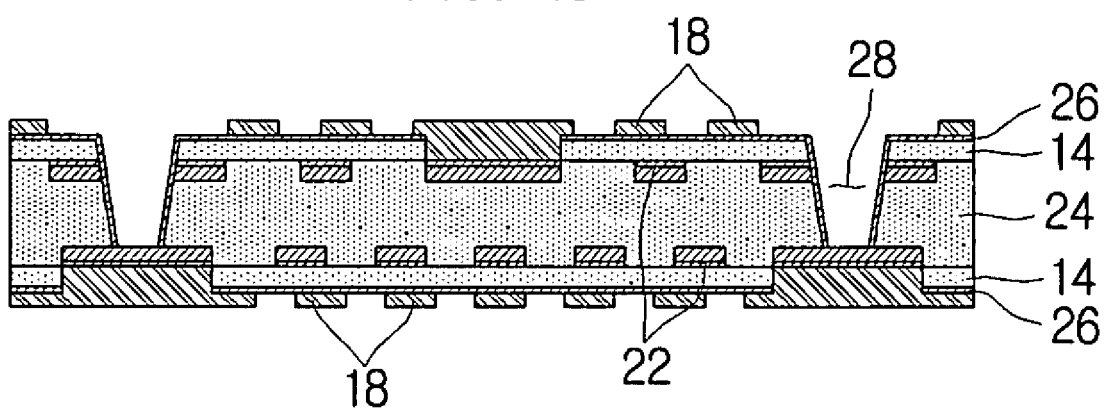
Figure 17:
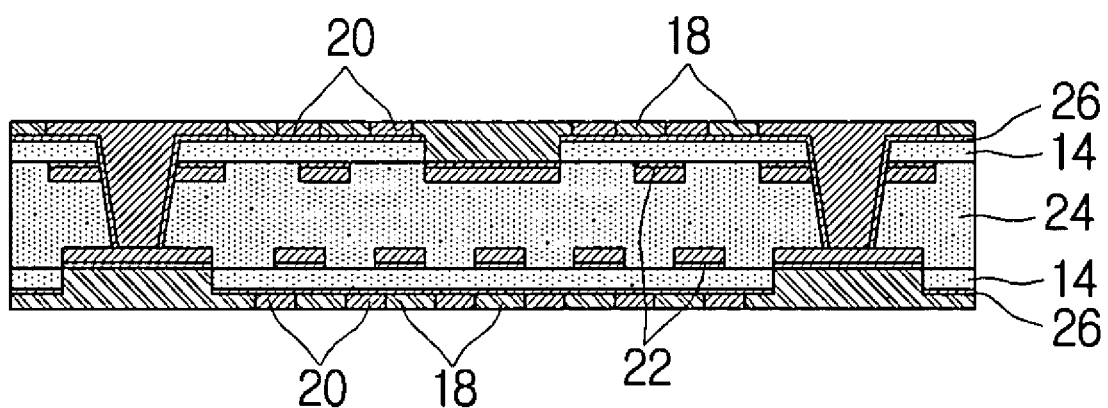
Figure 18:
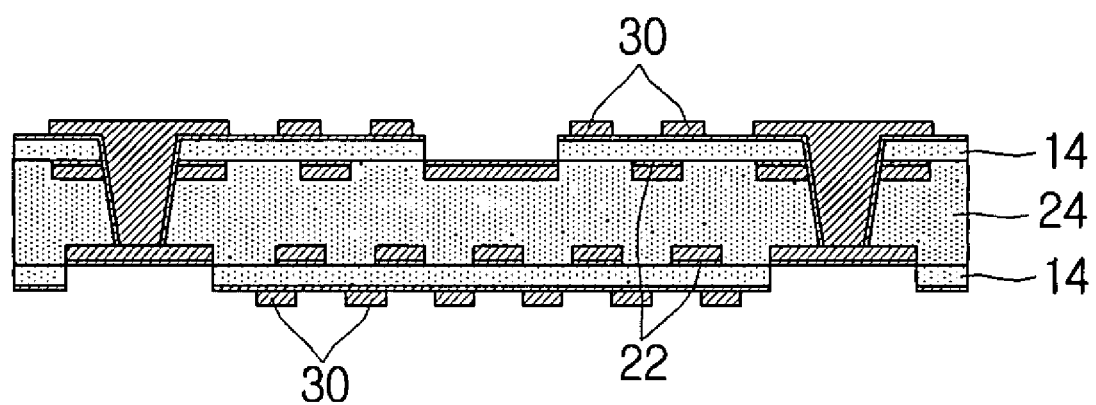
Figure 19:
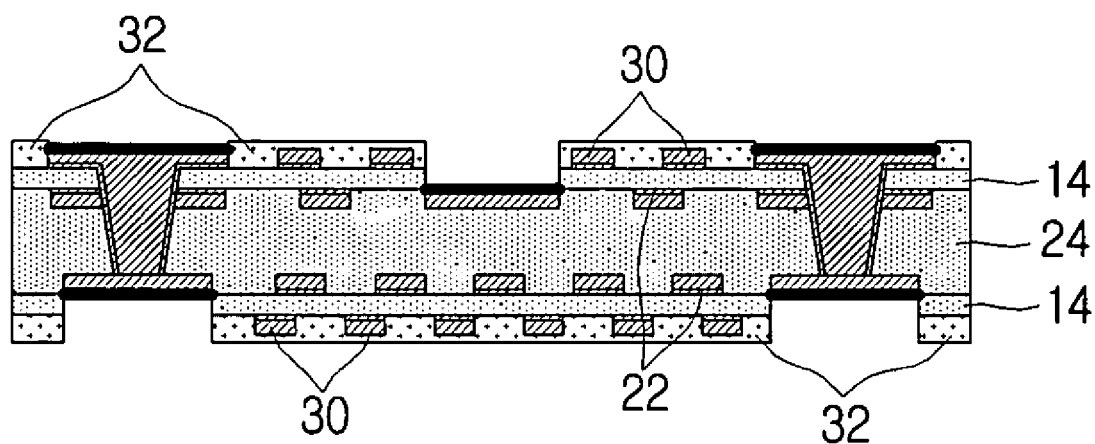

The method of manufacturing a circuit board according to certain embodiments of the invention will be described below in more detail with reference to the accompanying drawings, in which those components are rendered the same reference numeral that are the same or are in correspondence, regardless of the figure number, and redundant explanations are omitted.

FIG. 1, FIG. 2, FIG. 3, FIG. 4, FIG. 5, FIG. 6, FIG. 7, FIG. 8, FIG. 9 and FIG. 10 represent a flow diagram illustrating a method of manufacturing a circuit board according to an embodiment of the invention. In FIG. 1 to FIG. 10 are illustrated a first seed layer 12, an insulation layer 14, a carrier 16, plating resist 18, conductive material 20, a first circuit pattern 22, an insulation board 24, a second seed layer 26, and a second circuit pattern 30.

In this embodiment, a first circuit pattern 22 may be buried in one side of an insulation board 24 with a portion of the first circuit pattern 22 exposed, an insulation layer 14 may be formed thereon, and a second circuit pattern 30 may be formed on the insulation layer 14, whereby a method is provided of readily manufacturing a circuit board of a multi-layer structure. Here, the insulation layer 14 may serve as a second insulation board.

More specifically, the first circuit pattern 22 may be formed on one side of the insulation layer 14 of a carrier 16 formed by stacking an insulation layer 14 and a first seed layer 12 in order, the carrier 16 and the insulation board 24 may be stacked and pressed such that the side of the carrier 16 on which the first circuit pattern 22 is formed faces the insulation board 24, and then the carrier 16 may be removed from the insulation board, to transfer the first circuit pattern 22 and the insulation layer 14 formed on the carrier 16 onto the insulation board 24. By forming the second circuit pattern 30 on the other side of the insulation layer 14 transferred onto the insulation board 24, the first circuit pattern 22 may be buried in the insulation board 24, and the second circuit pattern 30 may be formed on the other side of the insulation layer 14 transferred to the insulation board 24, so that a circuit board of a multi-layered structure may be manufactured that has circuit patterns of a high density. Here, the insulation layer 14 may be such that is stacked temporarily on the side of the carrier 16, and by forming the first circuit pattern 22 on the temporarily stacked insulation layer 14, stacking the carrier 16 on the insulation board 24 such that the side of the carrier 16 faces the insulation board 24 to press the first circuit pattern 22 into the insulation board 24, and then removing the carrier 16, a multi-layer structure circuit board may readily be formed. Here, the insulation layer 14 may be formed on the carrier 16 with a thickness of 20 to 25 μm, so that there is no electrical short-circuiting between the first circuit pattern 22 and second circuit pattern 30. To form the insulation layer 14 on the carrier 16, an insulation film made of an insulating material may be attached to the carrier 16.

A process of forming the first circuit pattern 22 on the insulation layer 14 of the carrier 16, on which the insulation layer 14 and the first seed layer 12 are stacked in order, may be as follows. Plating resist 18 may be selectively formed on the first seed layer 12 to form an intaglio pattern corresponding to the first circuit pattern 22, and electroplating may be performed to fill a conductive material in the intaglio pattern. Then, the plating resist 18 and the non-activated first seed layer 12 may be removed, to form the first circuit pattern 22 on the insulation layer 14.

A method of selectively forming plating resist 18 on the insulation layer 14 of the carrier 16 to form an intaglio pattern corresponding to the first circuit pattern 22 may include, first, coating a photosensitive material on the first seed layer 12 formed on the insulation layer 14 of the carrier 16, fabricating a photomask in correspondence with the first circuit pattern 22, and afterwards stacking the photomask on the side of carrier 16 coated with photosensitive material, and then exposing to ultraviolet rays. After the exposure, when the non-cured portions of the photosensitive material are developed with developing liquid, an intaglio pattern that is in correspondence with the first circuit pattern 22 may be formed on the first seed layer 12 of the carrier 16. The cured photosensitive material that is not removed by the developing liquid may become the plating resist 18.

When the intaglio pattern that is in correspondence with the first circuit pattern 22 is formed on the first seed layer 12 of the carrier 16, electroplating may be performed using the first seed layer 12 as the electrode, to fill the intaglio pattern with a conductive material. The conductive material 20 may not be formed on regions of the first seed layer 12 where the plating resist 18 is formed, due to the plating resist 18 that impedes plating. A conductive material known to those skilled in the art may be used, such as aluminum (Al), silver (Ag), copper (Cu), and chromium (Cr), etc., for the conductive material 20 filled in the intaglio pattern.

Besides the present embodiment, filling conductive material in the intaglio pattern may include any method apparent to those skilled in the art, such as forming a seed layer on the intaglio pattern by electroless plating and using the seed layer as an electrode for electroplating, in those cases where a carrier 16 is used that does not have a first seed layer 12, filling with conductive paste using a blade, filling with conductive ink by inkjet printing, and filling by polymerizing a conductive polymer, etc.

When the intaglio pattern corresponding to the first circuit pattern 22 is filled with conductive material by electroplating, the plating resist 18 may be removed, and the non-activated seed layer may be removed again, to form the first circuit pattern 22 on the insulation layer 14 of the carrier 16.

Here, the non-activated seed layer refers to the regions of the seed layer which does not function as an electrode because of the plating resist 18 so that the conductive material 20 is not formed thereon.

When the first circuit pattern 22 is formed on the insulation layer 14 of the carrier 16, the carrier 16 and the insulation board 24 may be stacked, such that the side of the carrier 16 on which the first circuit pattern 22 is formed faces the insulation board 24, and pressed together, so that the first circuit pattern 22 may be buried in the insulation board 24.

The insulation board 24 may include at least one of thermoplastic resin and glass epoxy resin, and when the first circuit pattern 22 is being transcribed into the insulation board 24, the insulation board 24 may be in a softened state. That is, after softening the insulation board 24 by raising the temperature to the softening temperature of the thermoplastic and/or glass epoxy resin, burying in insulation board 24 the first circuit pattern 22 that is formed in relievo on the carrier 16, and then separating or removing the carrier 16, the insulation board 24 may be manufactured, when the insulation board 24 is cured, that has the first circuit pattern 22 in a buried form.

Here, it is also possible to use prepreg for the insulation board 24, in which thermosetting resin is impregnated in glass fibers to provide a semi-cured state.

When the carrier 16 is separated or removed after the carrier 16 and the insulation board 24 are pressed such that the first circuit pattern 22 is buried in the insulation board 24, the first circuit pattern 22 may be buried in the insulation board 24, while the insulation layer 14 may be transferred onto the insulation board 24.

With regards methods of removing the carrier 16, if the carrier 16 is made of a metal plate, the removal may involve etching the metal plate, or if the carrier 16 is made of a film such as of resin, etc., and is attached to the insulation layer 14 by a thermoplastic adhesive, it is possible to separate the carrier 16 by applying a particular temperature such that decreases the adhesion of the adhesive. In this embodiment, a copper (Cu) plate is used as the carrier 16, and the carrier 16 made of copper (Cu) may be removed by etching.

After removing the carrier 16, a second circuit pattern 30 may be formed on the insulation layer 14 transferred onto the insulation board 24. In this case, the insulation layer 14 may serve as a second insulation board, and as described above, may be formed with a thickness of 20 µm to 25 µm, so that there is no electrical short-circuiting between the first circuit pattern 22 and second circuit pattern 30.

A method of forming the second circuit pattern 30 on the insulation layer 14 transferred onto the insulation board 24 may include forming a second seed layer 26 on the insulation layer 14, selectively forming plating resist 18 on the second seed layer 26 to form an intaglio pattern corresponding to the second circuit pattern 30, and then performing electroplating using the second seed layer 26 as the electrode to fill conductive material in the intaglio pattern. Next, by removing the plating resist 18 and the non-activated second seed layer 26, the second circuit pattern 30 may be formed on the insulation layer 14. The same method may be used for forming the second circuit pattern 30 on the insulation layer 14, as the method described above for forming the first circuit pattern 22 on the insulation layer 14 of the carrier 16, and thus the description will not be repeated.

As described above, a simple method may be used to manufacture a board in which the insulation board 24 is stacked in two layers. (In this embodiment, the insulation board 24 and the insulation layer 14 form a two-layer structure.)

FIG. 11, FIG. 12, FIG. 13, FIG. 14, FIG. 15, FIG. 16, FIG. 17, FIG. 18 and FIG. 19 represent a flow diagram illustrating a method of manufacturing a circuit board according to another embodiment of the invention. In FIG. 11 to FIG. 19 are illustrated insulation layers 14, carriers 16, plating resist 18, conductive material 20, first circuit patterns 22, an insulation board 24, second seed layers 26, via holes 28, second circuit patterns 30, and solder resist 32.

In this embodiment, two carriers 16 are used to form two layers of circuit patterns each on both sides of the insulation board 24, thereby providing a method of manufacturing a board having a four-layer structure.

According to the method described above, a first circuit pattern 22 may be formed on each insulation layer 14 of the two carriers 16, on which insulation layers 14 and seed layers are stacked in order.

When the first circuit pattern 22 is formed on each of the insulation layers 14 of the two carriers 16, the two carriers 16 are stacked such that the sides on which the first circuit patterns 22 are formed face either side of the insulation board 24 and then pressed together, so that the first circuit pattern 22 is buried each in both sides of the insulation board 24.

When the two carriers 16 are separated or removed after the two carriers 16 are pressed with the insulation board 24 interposed in-between, such that the first circuit pattern 22 is buried in either side of the insulation board 24, the first circuit pattern 22 may be buried each in both sides of the insulation board 24, while the insulation layer 14 may be transferred each onto both sides of the insulation board 24. In other words, a board may be manufactured that has insulation boards 24 stacked in three layers. (In this embodiment, the insulation board 24 and the two insulation layers 14 form a three-layer structure.)

Afterwards, via holes 28 may be processed to electrically interconnect the first circuit patterns 22 and second circuit patterns 30 formed on the two insulation layers 14 and the insulation board 24. Here, it is also possible to form via holes 28 for electrical interconnection between the circuit patterns of the insulation board 24 and an insulation layer 14 formed on a side of the insulation board 24, as illustrated in FIG. 11 to FIG. 19.

After processing the via holes 28, the second circuit pattern 30 may be formed on each of the two insulation layers 14, where a method of forming the second circuit patterns 30 may include first forming second seed layers 26 by electroless plating to include the inner walls of the via holes 28, selectively forming plating resist 18 on the second seed layers 26 to form intaglio patterns corresponding to the second circuit patterns 30, and then filling conductive material 20 in the intaglio patterns by electroplating. When the intaglio patterns are filled with conductive material 20, the plating resist 18 and non-activated second seed layers may be removed.

Afterwards, solder resist 32 may be applied to protect the surface of the board as well as the circuits exposed at the outer layers. A gold plating process may be performed at the pad portions where a semiconductor chip, etc., is to be coupled.

Figure 20:
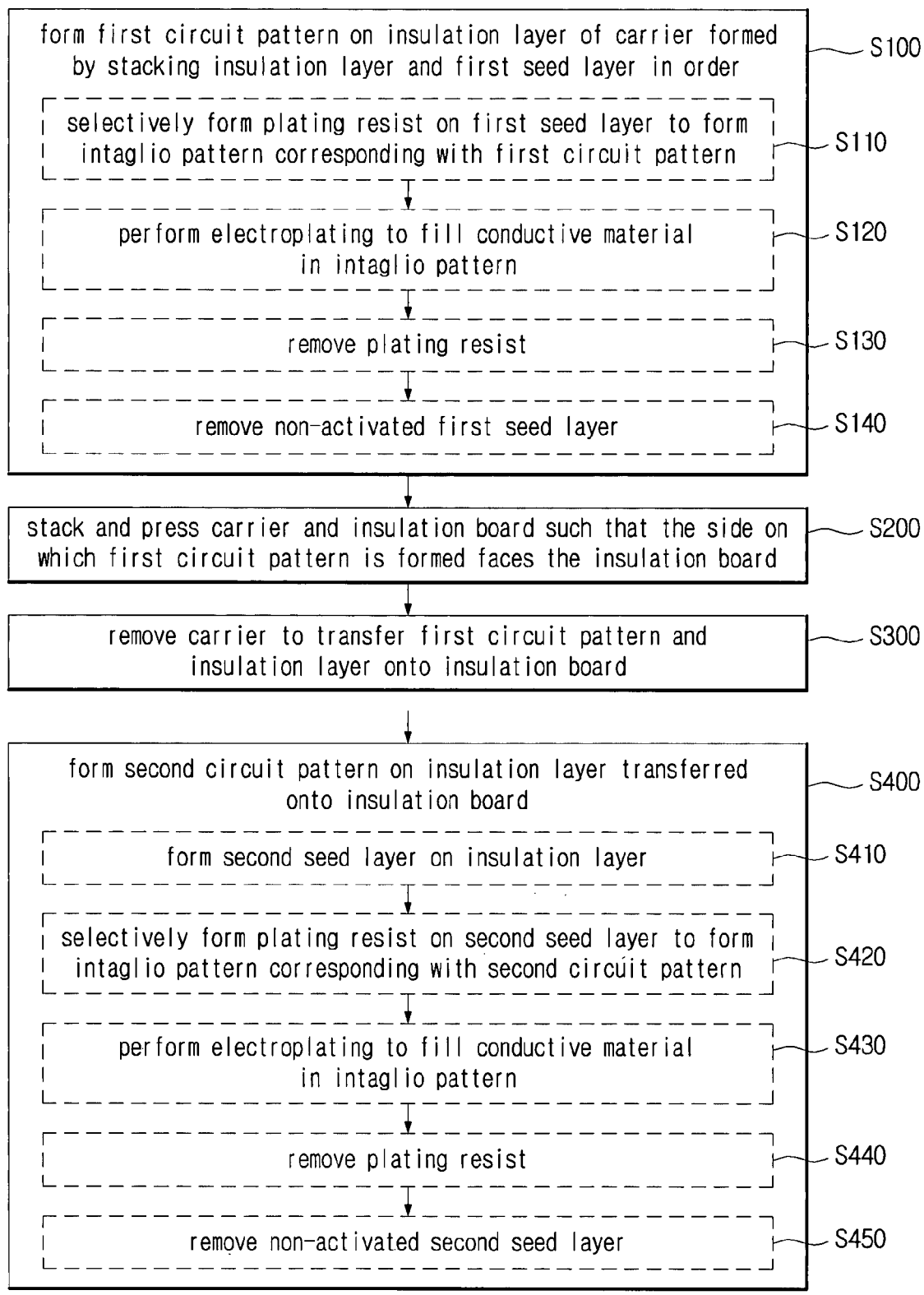
FIG. 20 is a flowchart illustrating a method of manufacturing a circuit board according to an embodiment of the invention.

FIG. 20 is a flowchart illustrating a method of manufacturing a circuit board according to an embodiment of the invention. Referring to FIG. 20, in operation S100, a first circuit pattern may be formed on the insulation layer of a carrier formed by stacking in order an insulation layer and a first seed layer. The insulation layer stacked on the carrier may be formed with a thickness of 20 to 25 µm, so that there is no electrical short-circuiting between the first circuit pattern and second circuit pattern. Here, the insulation layer may be formed on the carrier by attaching an insulation film made of an insulating material onto the carrier.

A process of forming the first circuit pattern on the insulation layer of the carrier, on which the insulation layer and the first seed layer are stacked in order, may include selectively forming plating resist on the first seed layer to form an intaglio pattern corresponding to the first circuit pattern, performing electroplating to fill a conductive material in the intaglio pattern, and then removing the plating resist and the non-activated first seed layer, to form the first circuit pattern on the insulation layer.

A method of selectively forming plating resist on the insulation layer of the carrier to form an intaglio pattern corresponding to the first circuit pattern may include, first, coating a photosensitive material on the first seed layer formed on the insulation layer of the carrier, fabricating a photomask in correspondence with the first circuit pattern, and afterwards stacking the photomask on the side of carrier coated with photosensitive material, and then exposing to ultraviolet rays. After the exposure, when the non-cured portions of the photosensitive material are developed with developing liquid, an intaglio pattern that is in correspondence with the first circuit pattern may be formed on the first seed layer of the carrier. The cured photosensitive material that is not removed by the developing liquid may become the plating resist (S110).

When the intaglio pattern in correspondence with the first circuit pattern is formed on the first seed layer of the carrier, electroplating may be performed using the first seed layer as the electrode, to fill the intaglio pattern with a conductive material. Here, the conductive material may not be formed on regions of the first seed layer where the plating resist is formed, due to the plating resist that impedes the plating. A conductive material apparent to those skilled in the art may be used for the conductive material filled in the intaglio pattern, such as aluminum (Al), silver (Ag), copper (Cu), and chromium (Cr), etc. (S120)

When the intaglio pattern corresponding to the first circuit pattern is filled with conductive material by electroplating, the plating resist may be removed (S130), and the non-activated seed layer may be removed again, to form the first circuit pattern on the insulation layer of the carrier.

Here, the non-activated seed layer refers to the regions of the seed layer which does not function as an electrode because of the plating resist so that the conductive material is not formed thereon (S140).

In operation S200, the carrier and the insulation board may be stacked such that the side of the carrier on which the first circuit pattern is formed faces the insulation board, and may be pressed together, so that the first circuit pattern may be buried in the insulation board.

In operation S300, the carrier may be separated or removed, after the carrier and the insulation board are pressed such that the first circuit pattern is buried in the insulation board, whereby the first circuit pattern may be buried in the insulation board, while the insulation layer may be transferred onto the insulation board.

With regards methods of removing the carrier, if the carrier is made of a metal plate, the removal may involve etching the metal plate, or if the carrier is made of a film such as of resin, etc., and is attached to the insulation layer by a thermoplastic adhesive, it is possible to separate the carrier by applying a particular temperature such that decreases the adhesion of the adhesive. In this embodiment, a copper (Cu) plate may be used as the carrier, and the carrier made of copper (Cu) may be removed by etching.

In operation S400, a second circuit pattern may be formed on the insulation layer transferred onto the insulation board. In this case, the insulation layer may serve as a second insulation board, and as described above, may be formed with a thickness of 20 to 25 μm, so that there is no electrical short-circuiting between the first circuit pattern and second circuit pattern.

A method of forming the second circuit pattern on the insulation layer transferred onto the insulation board may include forming a second seed layer on the insulation layer (S410), selectively forming plating resist on the second seed layer to form an intaglio pattern corresponding to the second circuit pattern (S420), and then performing electroplating using the second seed layer as the electrode to fill conductive material in the intaglio pattern (S430). Next, by removing the plating resist and the non-activated second seed layer, the second circuit pattern may be formed on the insulation layer (S440, S450). The same method may be used for forming the second circuit pattern on the insulation layer, as the method described above for forming the first circuit pattern on the insulation layer of the carrier, and thus the description will not be repeated.

As set forth above, certain aspects of the invention allow fine pitch circuit patterns, to enable the manufacture of fine circuit patterns of high density on the board, and allow the manufacture of a multi-layer circuit board with a simple process.

Also, with certain aspects of the invention, a circuit board of a multi-layered structure can be manufactured by burying the circuit patterns in the board and transcribing thin insulation layers onto the board, to reduce the overall thickness of the board.

Moreover, as the circuits can be formed inside the board, there can be less peeling, as well as greater evenness and easier heat release. In addition, there is less likelihood of bending of the circuit board, and higher reliability with respect to ion migration between adjacent circuits.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a circuit board, the method comprising:
    forming a first circuit pattern protruded on one surface of an insulation layer of a carrier on which the insulation layer and a first seed layer are successively stacked;
    stacking and pressing one surface of the carrier having the first circuit pattern formed thereon by making the one surface of the carrier face an insulation board such that the first circuit pattern is buried in the insulation board;
    removing the carrier to transfer the first circuit pattern and the insulation layer onto the insulation board; and
    forming a second circuit pattern on the other surface of the insulation layer transferred to the insulation board.

2. The method of claim 1, wherein the insulation layer, in the forming of the first circuit pattern, is formed with a thickness of 20 μm to 25 μm in the carrier.

3. The method of claim 1, wherein the insulation layer, in the forming of the first circuit pattern, is formed by attaching an insulation film on the carrier.

4. The method of claim 1, wherein the forming of the first circuit pattern comprises:
    selectively forming plating resist on the first seed layer to form an intaglio pattern corresponding to the first circuit pattern;
    filling conductive material in the intaglio pattern by performing electroplating;
    removing the plating resist; and
    removing the non-activated first seed layer.

5. The method of claim 1, wherein the carrier is a metal plate, and
    the removing is performed by etching the metal plate.

6. The method of claim 1, wherein the forming of the second circuit pattern comprises:
    forming a second seed layer on the insulation layer;
    selectively forming plating resist on the second seed layer to form an intaglio pattern corresponding to the second circuit pattern;
    filling conductive material in the intaglio pattern by performing electroplating;
    removing the plating resist; and
    removing the non-activated second seed layer.

7. The method of claim 1, wherein the forming of the first circuit pattern comprises:
    forming a first circuit pattern on the insulation layer of each of two carriers,
    the stacking and pressing comprises:
    stacking and pressing the two carriers and an insulation board such that the sides of the carriers having the first circuit patterns formed thereon face either side of the insulation board,
    wherein the removing comprises removing the two carriers, and
    the forming of the second circuit pattern comprises, forming a second circuit pattern on the other side of each of the insulation layers.

8. The method of claim 7, further comprising, before the forming of the second circuit pattern on the other side of each of the insulation layers:
    forming at least one via hole in the insulation board, and
    further comprising, after the forming of the second circuit pattern on the other side of each of the insulation layers:
    selectively coating solder resist on the insulation board.

* * * * *

UNITED STATES PATENT AND TRADEMARK OFFICE
CERTIFICATE OF CORRECTION

PATENT NO.        : 7,937,833 B2                                    Page 1 of 1
APPLICATION NO.   : 11/976072
DATED             : May 10, 2011
INVENTOR(S)       : Hoe-Ku Jung et al.

It is certified that error appears in the above-identified patent and that said Letters Patent is hereby corrected as shown below:

Column 8, Line 56 (Approx), In Claim 7, delete "comprises," and insert --comprises--, therefore.

Signed and Sealed this
Thirteenth Day of September, 2011

David J. Kappos
*Director of the United States Patent and Trademark Office*